MACHINE FOR MOUNTING ELECTRICAL COMPONENTS

Filed July 5, 1955 5 Sheets-Sheet 1

INVENTOR.
GEORGE A. KWASNIEWSKI
BY PAUL S. PETERSEN
William C. Stueber
Attorney

March 25, 1958 G. A. KWASNIEWSKI ET AL 2,827,630

MACHINE FOR MOUNTING ELECTRICAL COMPONENTS

Filed July 5, 1955 5 Sheets-Sheet 2

INVENTOR.
GEORGE A. KWASNIEWSKI
PAUL S. PETERSEN
BY William C. Stueber
Attorney

MACHINE FOR MOUNTING ELECTRICAL COMPONENTS

Filed July 5, 1955 5 Sheets-Sheet 3

INVENTOR.
GEORGE A. KWASNIEWSKI
PAUL S. PETERSEN
By William C Stueber
Attorney

March 25, 1958 G. A. KWASNIEWSKI ET AL 2,827,630

MACHINE FOR MOUNTING ELECTRICAL COMPONENTS

Filed July 5, 1955 5 Sheets-Sheet 4

INVENTOR.
GEORGE A. KWASNIEWSKI
PAUL S. PETERSEN
BY William C. Stueber
Attorney

INVENTOR.
GEORGE A. KWASNIEWSKI
PAUL S. PETERSEN
BY William C. Stucker
Attorney 2,827,630

MACHINE FOR MOUNTING ELECTRICAL COMPONENTS

George A. Kwasniewski, Minneapolis, and Paul S. Petersen, St. Louis Park, Minn., assignors to General Mills, Inc., a corporation of Delaware Application July 5, 1955, Serial No. 519,871

25 Claims. (Cl. 1—2)

The present invention relates to mechanisms for attaching electrical components to circuit boards.

In the present commercial design of electronic equipment a printed circuit board is frequently used wherein lines of conducting material are sprayed, etched, imbedded, or otherwise attached to a non-conducting material. Electrical component leads are attached to the end of the conducting portions to complete the electrical circuit. In an electronic circuit such as a radio for example, a circuit board is used with resistors, condensers, conductors, transformers, and the like having their leads connected to the ends of the conducting portions. With the use of printed circuit boards it becomes unnecessary to span the gap between the electrical terminals or leads of the components with wire which takes considerable assembly time since each wire must be cut, attached and soldered to the component leads. The pattern of the electrical conductors is arranged on the printed circuit board in such a manner that the ends of the conducting strips on the board are spaced to be able to conveniently attach the component leads to the ends.

In an effort to improve on the use of the circuit board type of electrical construction, and reduce the time of assembly, components have been mechanically attached. This mechanical attachment is accomplished in a variety of ways, one of the methods being accomplished by providing a circuit board with holes through the board at the ends of the conducting strips so the leads of components can be inserted into the holes. The ends of the leads are then soldered to the conducting material on the circuit board either manually or by dipping the entire board into a pool of molten solder with the solder adhering to the conducting material and component leads to electrically join them.

Even with the use of an electrical printed circuit board instead of using old types of wired circuits and using improved methods of attaching electrical components to the board the process of assembling electrical equipment is long and tedious when done manually. Efforts therefore have been directed to attach the electrical components by machine. This is done by mechanically bending the electrical component leads and inserting the leads into the holes in the circuit board.

It is accordingly an object of the present invention to provide an improved mechanism which is simple and rugged in structure and which will handle individual electrical components, bending the leads toward the circuit board, and inserting the leads into the holes in the circuit board for purposes of mounting the component to the board and attaching the component leads to the electrical circuitry.

Another object of the invention is to provide a mechanical component attaching machine which surely handles the components and which is smooth in operation with the reduction of impact engagement between parts so as to make the machine better adaptable to high speed operation with longer wear of parts and less danger of damaging or dropping the electrical components.

Another object of the invention is to provide an improved electrical component attaching means which will more accurately attach the electrical component to the circuit board and will produce a better, more consist assembled product.

A more detailed object of the invention is to provide a component-attaching means which has improved fingers and improved operating mechanism for the fingers for bending and holding the electrical component leads and for inserting the leads into holes in the board.

Another object of the invention is to provide an apparatus for attaching electrical components which is more accurate in inserting the leads into the holes in the board and therefore causes less rejected boards.

Another object of the invention is to provide an improved electrical component attaching machine in which the components are smoothly delivered to the machine and are accurately and securely handled to reduce the droppage of components and to improve the consistency of the product.

A still further object of the invention is to provide an electrical component attaching machine which is capable of relatively high speed automatic operation but which gently handles the electrical components so as to reduce damage and breakage of the components.

Another object of the invention is to provide an improved electrical component attaching machine in which the depth of insertion of the component leads into the holes in the circuit boards is readily controllable.

Another object of the invention is to provide an electrical component attaching machine in which the component leads are projected into the holes in the component board and the component body may be held securely against the board to firmly support it for purposes of clinching the leads beneath the board.

Other objects and advantages will become more apparent in the following specification and claims taken in connection with the appended drawings in which:

Figures 2, 3, 4, 5, 6:
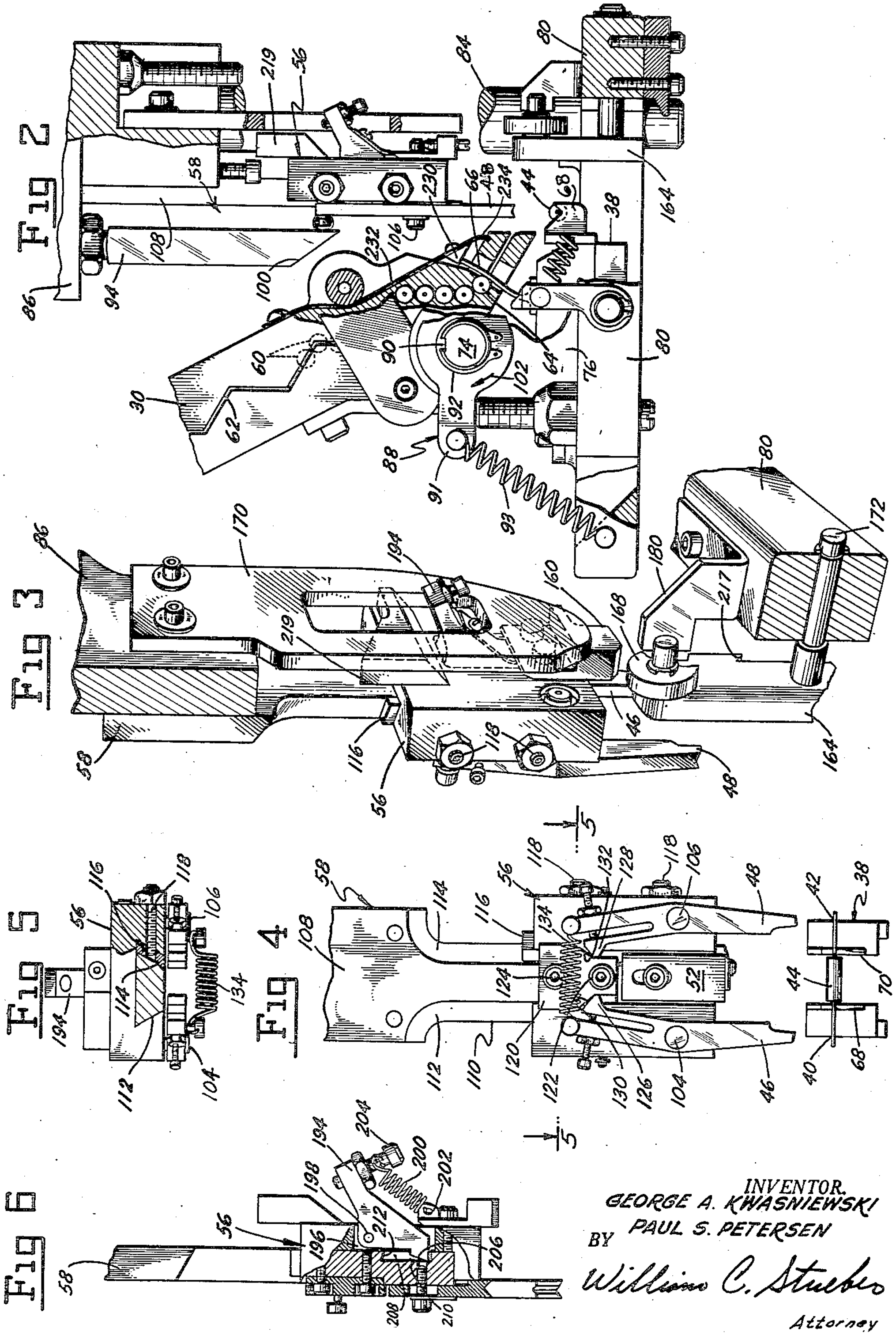
Figure 2 is a side elevational view of the electrical component attaching head with portions of the machine broken away to better show the operation of the parts.
Figure 3 is a perspective view of certain elements of the component attaching machine.
Figure 4 is a front elevational view of the mechanism for bending the component leads and carrying the component toward the board.
Figure 5 is a sectional view taken along line 5—5 of Figure 4.
Figure 6 is a side elevational view of the mechanism of Fig. 4 with certain portions of the elements removed to better illustrate the mechanism.
Figure 7:
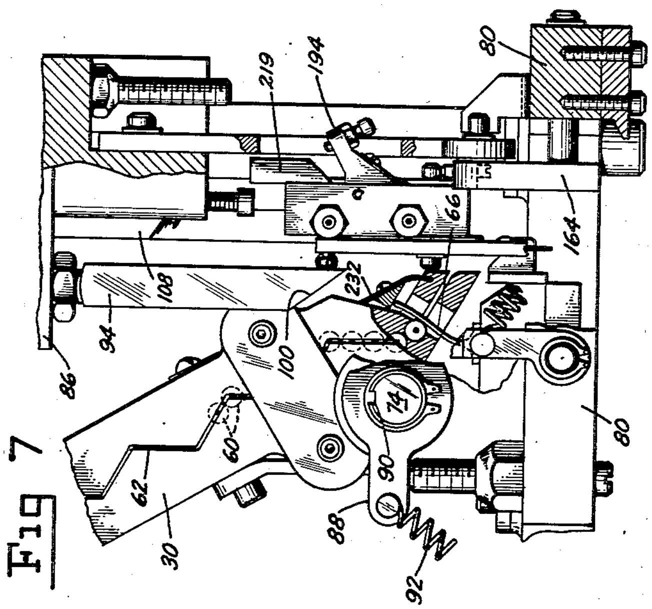
Figure 7 is a side elevational view of the component attaching mechanism with certain portions removed to better illustrate the mechanism. This figure is similar to Figure 2 except that the attaching tool has descended a part of its distance toward the circuit board.
Figure 12A:
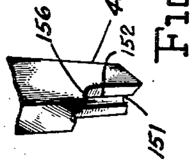
Figures 13, 13A, 14, 15, 16, 23:
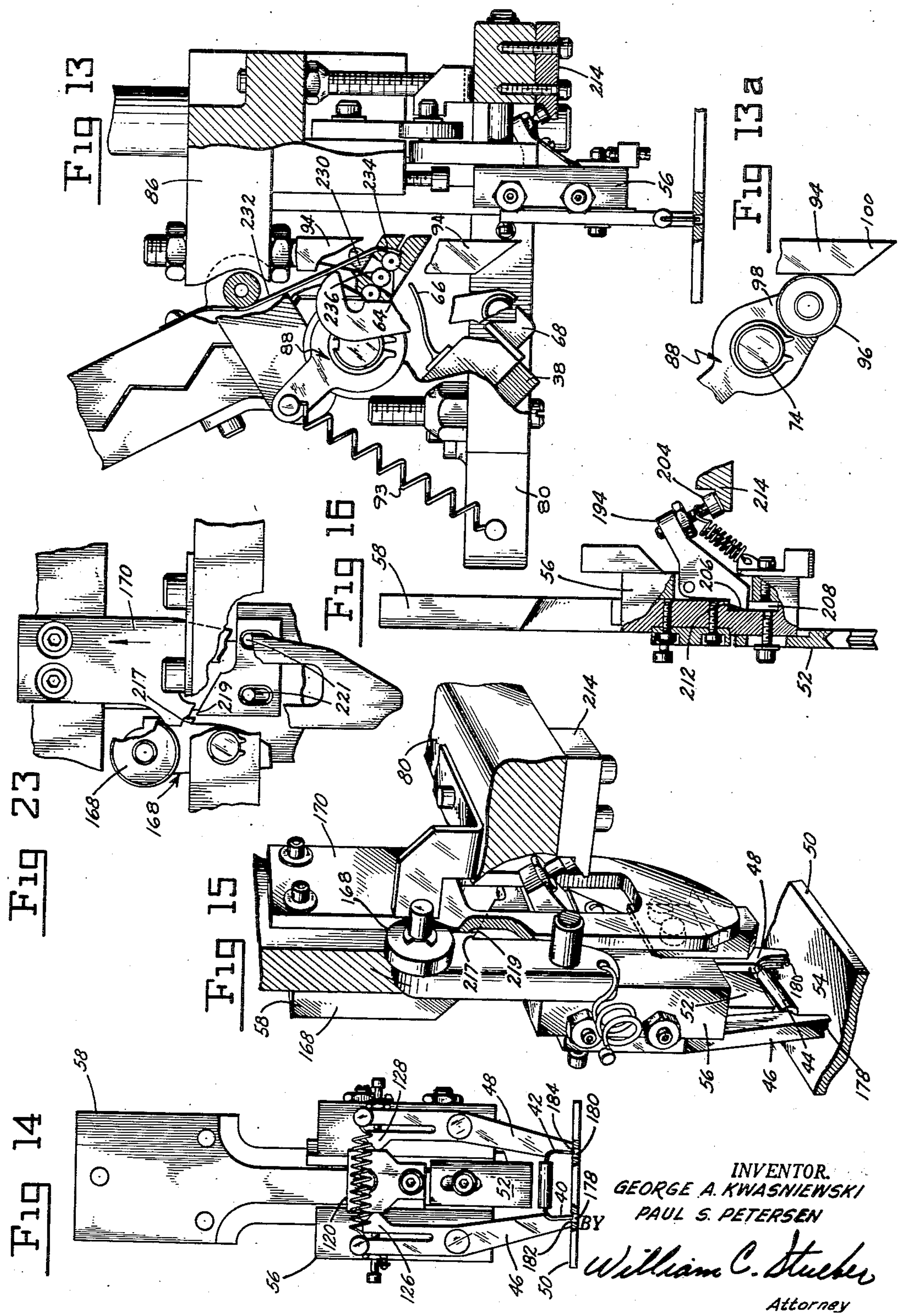
Figures 17, 18, 19, 20, 21, 22:
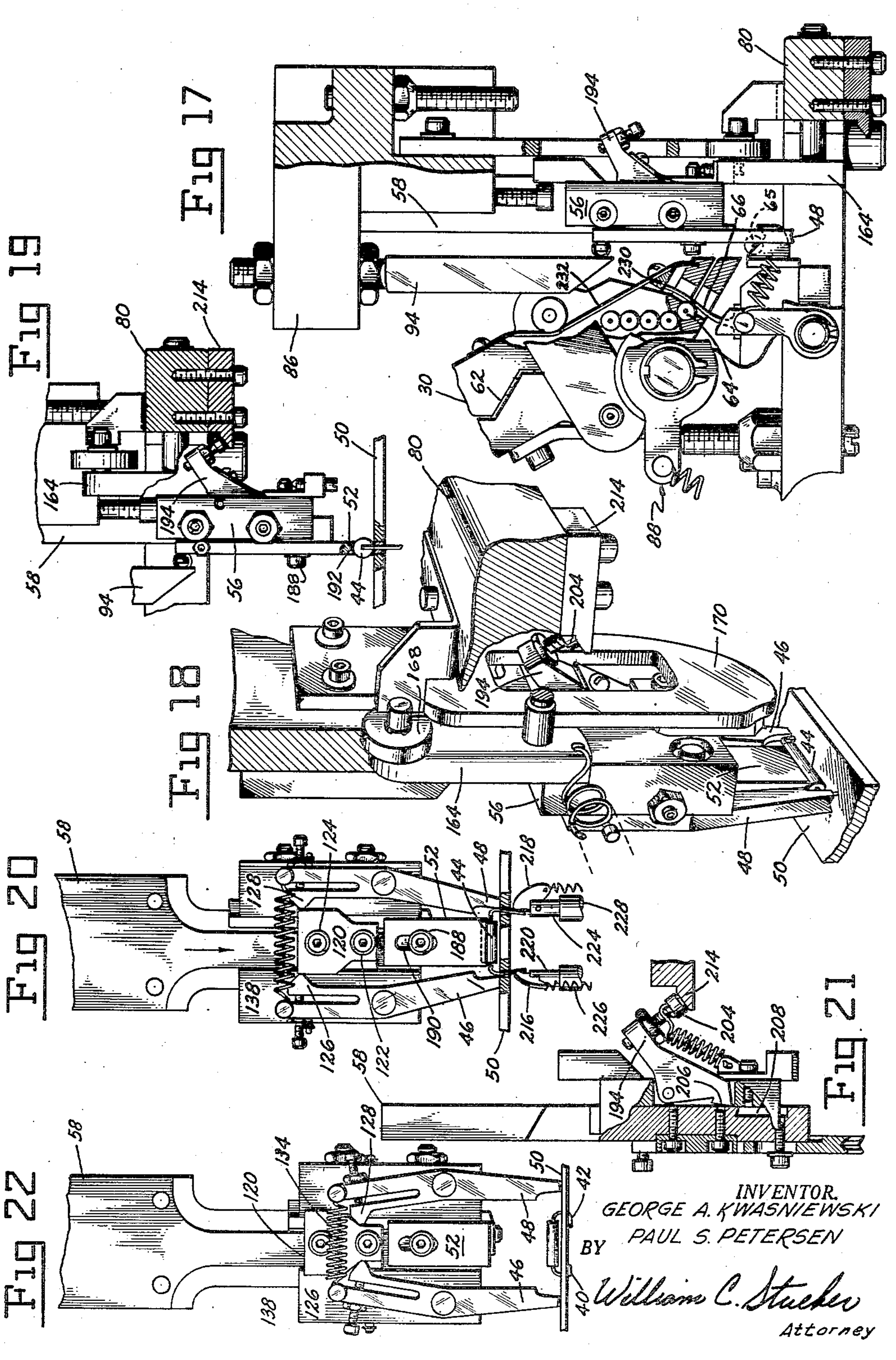

Figure 12*a* is a detailed perspective of the lower end of one of the lead bending fingers;

Figure 13 is a side elevational view of the component inserting mechanism with certain portions broken away for clarity. This figure is similar to Figures 2 and 7 but the inserting mechanism has descended to a position against the circuit board;

Figure 13*a* is a detailed view of the mechanism which was removed from the drawing of Figure 13;

Figure 14 is a front elevational view of the tool for inserting the electrical component;

Figure 15 is a perspective view of the component inserting mechanism and the catch for temporarily holding the inserting tool;

Figure 16 is a side elevational view of the component attaching mechanism being partly in section to illustrate the action of the mechanism;

Figure 17 is a side elevational view of the attaching mechanism similar to Figs. 2, 7, and 13 with the attaching mechanism returning to its normal position and the drawing illustrating the apparatus for feeding of a new electrical component;

Figure 18 is a perspective view of the attaching mechanism showing the relative position of the parts as the component body is pushed against the circuit board;

Figure 19 is a side elevational view with certain portions broken away, of the inserting mechanism showing the position of the parts when the component body has been pushed against the circuit board;

Figure 20 is a rear elevational view of the attaching mechanism illustrating the position of the parts of the component body pushed against the circuit board and the clinching mechanism in position ready to clinch the leads which project through the circuit board;

Figure 21 is a side elevational view having parts broken away and illustrating the relative position of the tool holder and its associated mechanism when the component is pushed against the circuit board;

Figure 22 is a perspective view of the attaching mechanism illustrating the fingers as they are spread apart just before the attaching mechanism is raised back to its normal position; and Figure 23 is an enlarged detailed view of the locking mechanism for sliding the tool holder down on the tool slide as the inserter is being raised to its normal position.

Figure 1:
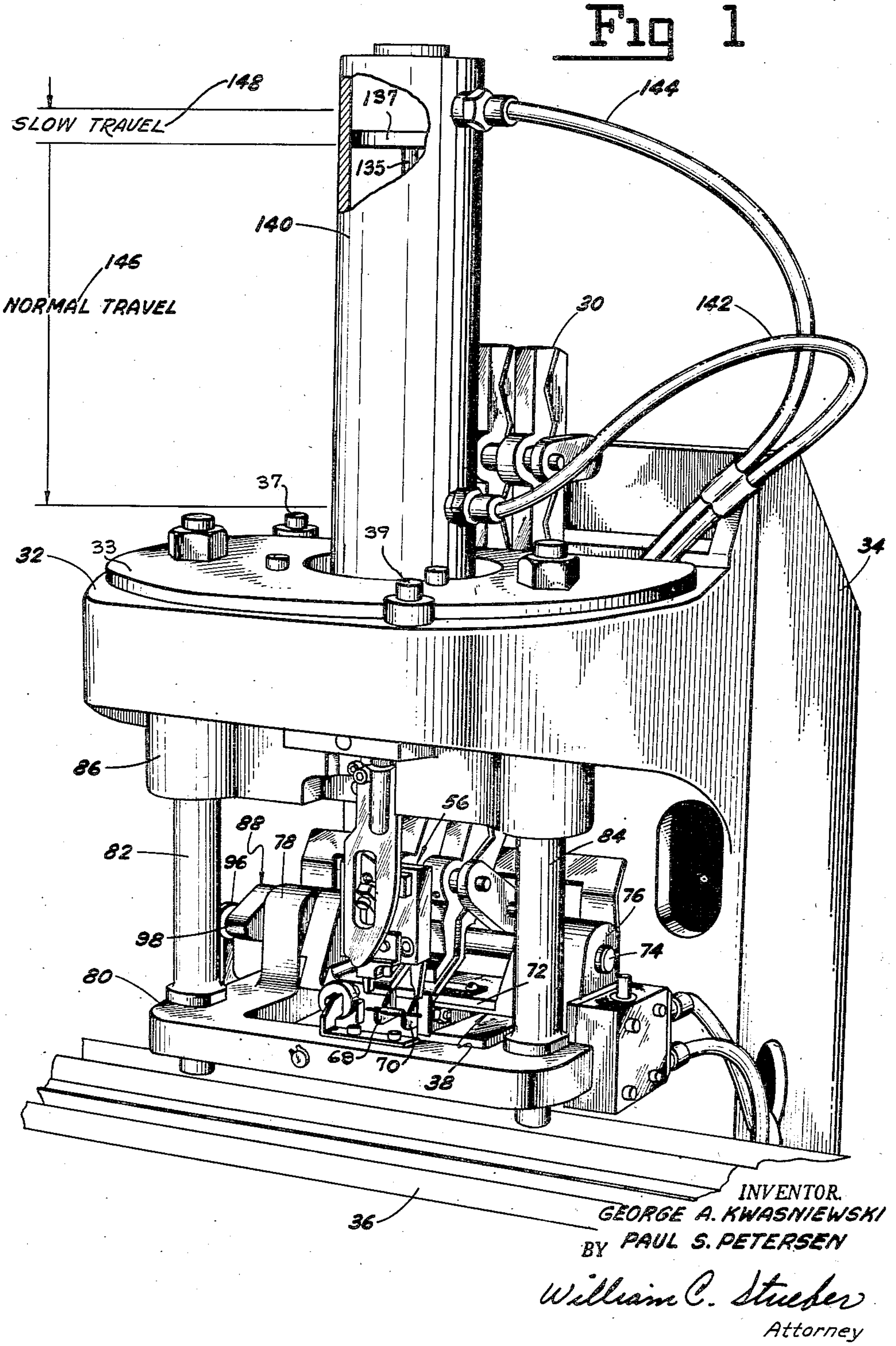
Figure 1 is a perspective view of the overall component attaching head.

The complete mechanism embodying the preferred form of the present invention is illustrated in Fig. 1. As shown in Fig. 1 and as used in general operation the mechanism is utilized for bending the ends of the leads in an electrical component such as the resistor, transistor, condenser and the like and pushing the leads through holes in a printed circuit board.

The printed circuit board may be of any desired type. The boards are generally formed of laminations of nonconducting material in which there are inlaid strips of conducting material. A conducting material is formed on the nonconducting material such as by etching, spraying and other methods well known to the printed circuit art. At the end of the conducting strips are holes projecting through the circuit board. To attach the component to the circuit board the leads are inserted into these holes. To solidly connect the leads to the ends of the conducting strips they are soldered to the strips or the entire board is dipped in solder and solder adheres to the conducting material and to the leads to form a juncture but does not adhere to the nonconducting material.

GENERAL PERFORMANCE OF MACHINE

The machine as illustrated in Fig. 1, is adapted to receive a continuing supply of electrical components such as resistors. The resistors are supplied from a magazine which rests on top of the feeder illustrated at 30 in Fig. 1. The over-all mechanism can be referred to as an attaching head and the framework of the attaching head, shown generally at 32, is supported from a supporting frame 34 which may be positioned adjacent a conveyor track 36 along which successive circuit boards are conveyed.

The circuit boards are moved along the conveyor track 36 by a conveyor and each successive board is individually stopped by the conveyor beneath the attaching head, whereupon an electrical component is attached to the board. The attaching head is also adapted to be used for individual operations where the board is manually placed beneath the attaching head or it may be used along with an automatic conveying line such as is pictured in Fig. 1. Further, the plurality of heads may be arranged along a conveyor unit to successively attach a plurality of components and the different heads can be adapted to attach components of different sizes or to attach different components with each head attaching its particular size or type of component. In this manner with a succession of heads a plurality of electrical components can be attached to each of the circuit boards to form a complete circuit.

The operating mechanism, which may be generally referred to as an attaching head is carried from a circular disc 33 which is supported in the frame 32. This disc is rotatable to adjust the rotational position of the attaching head in accordance with the position of the holes in a circuit board in which leads of a component are to be inserted. Clamping bolts such as 37 and 39 may be provided to clamp the supporting disc 33 in adjusted position.

The electrical component such as a resistor is fed into the machine through the feeder 30 and comes to rest supported on a supporting anvil 38 in the manner shown generally in Figs. 2 and 4. In this position on the supporting anvil the leads 40 and 42 of the resistor 44 are bent downwardly by the bending fingers 46 and 48, in the manner shown generally in Figs. 11 and 12.

Figures 11, 12:
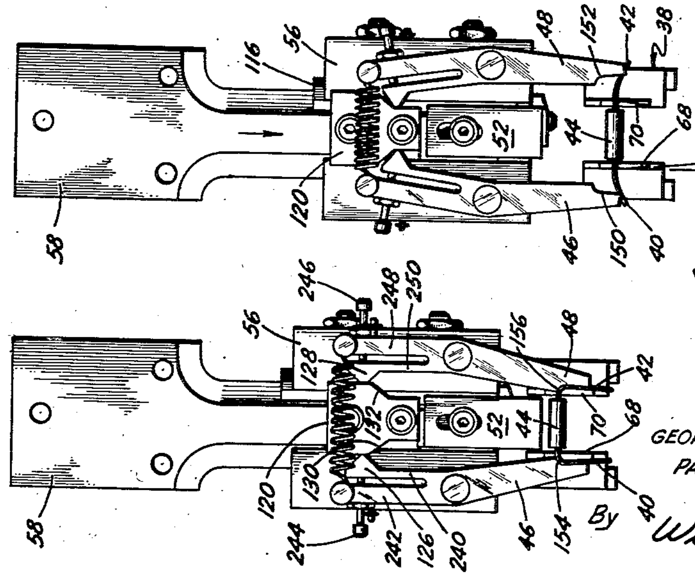
Figure 11 is a rear elevational view of the tool for bending the component lead.
Figure 12 is another elevational view from the rear of the tool of Figure 11 showing it in position after it has bent the component leads.

When the leads have been bent downwardly to the position as now indicated in Fig. 12 the electrical component is carried downwardly between the bending fingers so that the leads are inserted into the holes in the circuit board 50 in the manner illustrated generally in Fig. 14.

After the leads have been inserted into the holes the inserter plate 52 moves downwardly against the component body 44 to the position of Fig. 20 to project the leads further through the holes into the circuit board and to push and hold the body against the board.

The operation of the bending fingers in bending the component leads and in carrying the component against the board and the operation of the inserter plate are all accomplished by the downward movement of the corner tool or tool holder shown generally at 56 in Figs. 1 and 2. The tool holder is supported on the tool holder slide 58 and the relationship between the tool holder and the slide is illustrated in Fig. 3.

To accomplish the movements and functions of the elements which are supported from the tool holder 56, the tool holder moves between the series of three positions on the tool holder slide 58 and the positioning of the tool holder and the obtaining of its relative motion on the slide will be described in greater detail in connection with the description of the remaining elements of the machine.

These elements are so constructed and arranged to function cooperatively to obtain a smooth and rapid movement between parts in a manner that effectively and efficiently handles the electrical component without danger of dropping it or injuring it. The details of the elements of the component attaching machine will be described in units divided in accordance with the functions of the machine. The operation of bending the leads of the electrical component and the mechanism for achieving this will first be described.

*Bending the component leads*

The components are shown in Fig. 2 at 60 being stacked in the zig-zag feeding slot 62 of the feeder 30. The zig-zag slot functions to keep the individual electrical components straight and in a horizontal position as they pass downwardly through the feeder. The lowermost component 64 is held in the feeder by a stop 66. When the stop 66 moves out of the way of the lowermost component it rolls down through the feeder slot and drops downwardly to the position occupied by the component 44 as illustrated in Fig. 2.

The component 44 rests on the anvil fingers 68 and 70, the fingers being supported from the anvil shown generally at 38 in Figs. 2 and 4. The anvil functions to support the component 44 until its leads have been bent downwardly toward the component body. At that moment the anvil 38 swings the supporting fingers 68 and 70 out of the way to permit the component to be carried downwardly so that the leads may be inserted into the circuit board. The anvil 38 also functions to operate the stop 66 which feeds the individual components to the anvil.

The anvil assembly is illustrated in Figs. 1, 2, 7, 13, 13*a* and 17. The anvil fingers project horizontally from an anvil cradle shown at 72 in Fig. 1. This cradle is pivotally suspended from an anvil shaft 74, which is journaled in the upstanding brackets 76 and 78, as shown in Figs. 1 and 2. The brackets are integral with the frame plate 80, which is supported at the lower end of the posts 82 and 84. The posts form slides or ways for the sliding yoke 86, which carries the component attaching mechanism as it is lowered and raised. The upper end of the posts 82 and 84 are secured to the frame piece 32.

In returning to the description of the component supporting anvil, the anvil shaft 74 has connected to its end for purposes of rotating the shaft, an anvil crank arm 88. This anvil crank arm is secured to the shaft by means of a key 90 and is held on the end of the shaft by a locking ring 92 as may be seen in Fig. 2.

The anvil crank 88 has a rearwardly projecting arm 91 to which is connected a tension spring 93 and this spring applies tension to the anvil to maintain it in the position shown in Fig. 2 which is the position for supporting the electrical component. The end of this tension spring is secured to the horizontal frame plate 80.

When the electrical component 44 is supported on the anvil fingers in the manner illustrated in Figs. 2 and 4, the spring 93 has sufficient strength to prevent the anvil from pivoting to the out-of-way position of Fig. 13, so that the bending fingers may push down upon the component leads 40 and 42 and bend them downwardly.

This method of bending is illustrated in Figs. 11 and 12. After the leads have been bent downwardly the anvil is pivoted against the strength of the spring 93 by the cam 94 as illustrated in Figs. 13 and 13*a*. The cam 94 engages the roller 96 which is carried on the arm 98, which is part of the anvil crank 88. The cam 94 as shown in Figs. 2 and 13*a* has a slanting lower cam surface 100 which engages roller 96 pressing it downwardly and pivoting the crank arm 8 downwardly in the direction of the arrow 102 in Fig. 2. The action of this cam and its function to pivot the anvil 38 rearwardly, to move the anvil fingers 68 and 70 out of the way of the descending component bending fingers 46 and 48 will be later described in detail in connection with Figs. 7, 13, and 13*a*.

With the component in its position on the anvil fingers as illustrated in Figs. 2 and 4, the bending and inserting fingers 46 and 48 descend upon the component to bend the leads downwardly.

The bending fingers 46 and 48 are mounted on the tool body 56 and are pivotally supported on pins 104 and 106 respectively, Fig. 4. The tool body 56 is slideably mounted on the tool slide 58 and this construction may be best observed in connection with Figs. 2, 4, 5, and 6. The tool slide 58 has an upper wide flat portion 108 which is bolted to the sliding yoke 86 in the relationship illustrated in Fig. 2. Thus as the yoke illustrated in Fig. 1 moves up and down it will carry the tool slide 58 with it to carry the tool body 56 and its associated parts.

The lower portion 110 of the tool slide is reduced in size from the upper portion and has two beveled rear edges 112 and 114, as it may be seen in Figs. 4 and 5. The tool body 56 as illustrated in Fig. 5 is constructed to wrap around the rear of these beveled edges 112 and 114 to hold the tool body on the tool slide. A bearing block 116 is provided between the surface 114 of the tool slide and the tool body to adjust the sliding fit between the tool body and tool slide. The bearing block 116 is drawn inwardly to loosen the fit between the tool body and the tool slide or forced outwardly to tighten the fit by bolts 118 which control the position of the bearing block 116. Actually two bolts 118 are provided as shown in Fig. 4 to adjust the position of the bearing block over its entire vertical length.

Secured to the rear face of the tool slide 58 so as to be stationary with respect to the moving tool body 56 is a cam plate 120 secured by two bolts 122 and 124 threaded into the rear of the tool slide 58. This cam plate 120 is engaged by the cam followers 126 and 128 which are on the upper end of the bending fingers 46 and 48. It will be seen as the bending fingers move upwardly with the tool body as it slides on the tool slide, that the upper ends of the bending fingers will be forced apart as the finger followers 126 and 128 ride upwardly and outwardly on the sloping surfaces 130 and 132 of the cam plate, 120. The upper ends of the fingers are held in engagement with the cam plate by a coil spring 134 which is connected between the upper ends of the bending fingers.

The tool slide and the tool body which is carried thereon are moved down together without having relative movement from the uppermost position past the anvil to bend the component leads and to carry the component against the printed circuit board. These members are carried down with the sliding yoke 86 as pictured in Fig. 1. The sliding yoke 86 is connected to a piston rod 135 of a piston 137 which slides within a cylinder 140 of Fig. 1. This piston is fed air through lines 142 and 144.

To move the piston 137 up and down, air pressure is supplied to the machine and the flow of air to the hoses 142 and 144 is controlled by a pneumatic valve which is of a conventional type and is not shown in detail. To make the piston move downward in the cylinder 140 and carry the operating mechanism downward toward the circuit board, pressurized air is admitted through the hose 144 and the hose 142 is vented. To return the operating mechanism back to its return position pressurized air is admitted to line 142 and line 144 is vented. The cylinder and piston are of a conventional type and the piston within the cylinder travels at a speed in accordance with the rate in which air is admitted through the cylinder.

On the up travel of the piston, however, the piston travels at its regular speed for the major portion of the return as indicated by the space indicated as normal travel at 146. For the portion of travel at 148, however, the piston in its up travel slows down considerably. The piston also travels slowly in this space 148 in its down travel and resumes normal speed in space 146. The purpose of this area of slow travel, in this downward movement is to improve the bending operation of the fingers as they engage the component leads and bend them. In the up travel the purpose of the slow rate at the end is to improve the feeding of the components from the feeder. The advantages of this action will become more apparent as the remainder of the mechanism is explained in greater detail.

In returning now to the illustration of Fig. 4, it will be seen that the tool body or tool holder 56 is at its lowermost position with respect to the tool slide 58, when the mechanism is proceeding downwardly before the bending fingers 46 and 48 engage the leads 40 and 42 of the component. The tool is held in this down position by virtue of the tension spring 134 pulling the upper cam ends 126 and 128 of the bending fingers tightly against the cam plate 120, which causes the fingers to tend to stay at the lower portion of the cam and hold the tool body in its lowermost position.

The action of the bending fingers 46 and 48 as they first engage the component leads 40 and 42 is clearly illustrated in Fig. 11. As the fingers engage the leads they push them downwardly to bend them against the supporting anvil fingers 68 and 70. This bends the leads downwardly about their point of support on the anvil. It is to be noted that the lower ends of the fingers 46 and 48 are shaped so that the leads when bent will rest in a groove 151 on the fingers. Each of the fingers has this groove and each of the grooves are tapered inwardly so that the lower end of the groove extends closer to the component body than the upper end of the groove. The base of the groove is round but tapers upwardly in a straight line taper so that the grooves in the opposite finger are closer together at their lower end than at their upper end. This taper corresponds to the taper of the side of the anvil fingers 68 and 70 and the angle of taper of the anvil finger is indicated at 158, Fig. 11. Each of the fingers has a corresponding taper so that the lower end of the finger projects slightly under the bend of the component lead. This gives the component leads a slight underbend when they are forced downwardly by the fingers 46 and 48. The underbend is slight and a bend of 5° has been found to be a good amount, preventing the component from dropping out from between the fingers, but permitting it to be pushed downwardly between the fingers as is shown in Figs. 18 and 20. At the top of the concave curvatures are formed shoulders 154 and 156 as illustrated in Figs. 12 and 12*a*. This shoulder, as it will be noted, bears against the curved bent portion of the leads 40 and 42 and the bent portion of the leads forms a surface against which the shoulders of the bending fingers may push for pushing the tips of the leads into the openings of the circuit board. Since the force is on the leads the component bodies cannot possibly be damaged.

As the tool holder descends upon the resistor 44 supported by the anvil fingers, the bending fingers bend the leads downwardly and when the shoulders 154 and 156 of the bending fingers are substantially opposite the axis of the resistor 44, the path of travel of the tool body 56 is blocked so that it is caused to slide upwardly on the tool slide 58. When it slides upwardly on the tool slide the upper ends 126 and 128 of the bending fingers ride up on the cam 120 causing the top end of the fingers to move apart and forcing the bottom end of the fingers to move together, to bend the component leads downwardly to the position illustrated in Fig. 12.

The cam 120 is so designed that its inclined shoulders 130 and 132 force the upper cam ends 126 and 128 of the bending fingers outwardly. The lower ends of the bending fingers thereby force the component leads 40 and 42 tightly against the sides of the anvil fingers 68 and 70.

It will be seen that the upper ends 126 and 128 of the bending fingers 46 and 48 engage the inclined surfaces 130 and 132 of the cam 120 and as they ride up these inclined surfaces the lower ends of the fingers are forced together. The lower ends of the fingers force the leads against the outer shoulders of the anvil supporting fingers 68 and 70. It will be seen that the spacing between the inner surfaces of the bending fingers and the outer faces of the anvil fingers should be approximately equal to the size of the component leads or the leads will not be properly bent. In order to adjust this spacing the fingers are adjustable with respect to the cam.

For this purpose the upper ends of the fingers are bifurcated and as illustrated in Figs. 11 and 12, the upper projection 126 bearing against the cam is part of the bifurcated portion 240. The other bifurcated portion 242 carries an adjusting screw 244. The bifurcated portion 242 is rigid with respect to the finger 46 and the portion 240 is spring biased to bear against the end of the adjusting screw 244 so that as the screw 244 is threaded in or out the finger 240 will bear tightly against it. Thus as the screw 244 is threaded inwardly and the finger portion 240 is pushed over against the cam it will be seen that the lower end of the finger will be forced more tightly against the side of the anvil finger 68. Loosening the screw 244 permits the end of the finger 126 to move away from the cam, thus loosening the contact between the lower end of the bending finger 46 and the supporting anvil finger 68. The other finger 48 is constructed identical to the finger 46 and has an adjusting screw 246, which is threaded into portion 248 of the upper bifurcated end of the finger to bear against the spring portion 250 of the finger. Adjustment of this screw 246 will adjust the position of the lower end of finger 48.

It will be noted that the outer surfaces of the anvil fingers 68 and 70 slope inwardly and this inward slope cooperates with the concave grooves 150 and 152 in the lower ends of the fingers so that the leads, when forced tightly against the outer surfaces of the anvils point slightly inwardly. This inward point is illustrated by the angle shown at 158 in Fig. 11 which is the taper angle of the anvil supporting fingers.

Figure 8:
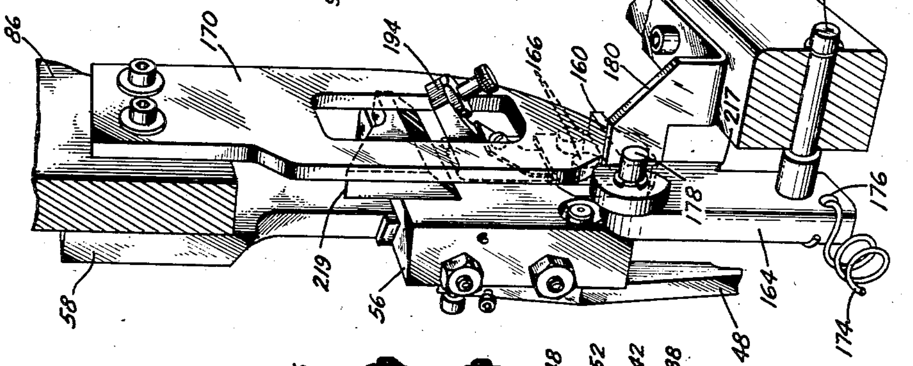
Figure 8 is a perspective view showing certain portions of the attaching mechanism.

Thus to bend the component leads inwardly the tool body 56 is locked to move upwardly on the tool slide 58 to an intermediate position on the slide. The tool slide 58 continues its steady downward movement during this action and this occurs during the slow period of travel as illustrated at 148 in Fig. 1. The relative upward movement of the tool body 56 is caused by the stop 160 Figs. 1, 8, 9, and 10 engaging the shoulder 162 on the catch arm 164. The stop 160 is bolted by bolts 166 to the front of the moving tool body 56 as is illustrated in Fig. 8. The catch arm 164 is mounted on the nonmoving frame plate 80.

Figures 9, 10:
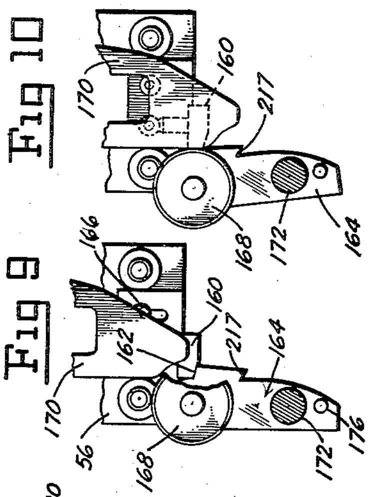
Figure 9 is an enlarged elevational detail view of the catch mechanism which stops the tool and causes operation of the bending fingers.
Figure 10 is also an enlarged detailed view of the mechanism of Figure 9 showing the parts in a slightly different position after the tool holder has descended somewhat further.

The action of the lower stop 160 engaging the shoulder 162 of the catch 164 is illustrated in detail in Figs. 9 and 10. As soon as the ends 126 and 128 of the lead bending fingers ride up on the cam 120 the tool body 56 is released in order that it may continue its downward travel with the tool slide 58. In order to accomplish this release the catch is moved to one side so that the shoulder 162 will be out of the way of the lower stop 160. To accomplish this, the catch carries a roller 168 which acts as a catch release and this catch release roller 168 is engaged by a catch release cam 170, which swings the catch arm to one side to move it out of the way of the lower stop.

The catch arm 164 is pivotally mounted on a pivot pin 172, as illustrated in Figs. 3 and 8. The pivot pin is secured to the horizontal frame piece 80. The catch arm 164 is normally held in a clockwise direction as illustrated in Figs. 3 and 8, to hold it in the position of Fig. 9 so that its shoulder 162 will engage the lower stop 160. To hold the catch arm in the stop position, a tension spring 174 is connected between the lower end of the catch arm and the horizontal frame plate 80. The tension spring passes through a hole 176 in the catch arm. The catch release roller 168 is rotatably mounted at the upper end of the catch arm 164 on a small shaft 178, which projects beyond the roller. This shaft 178 strikes a stop bracket 180, which limits the pivotal movement of the catch arm caused by the spring 174.

It is to be noted that the catch release cam 170 as is shown in Fig. 8 is carried with the tool slide 58 on the sliding yoke 86 as shown in Fig. 3, so that as the tool body 56 is stopped the release cam 170 continues to move downwardly and as it moves downwardly it engages the catch release roller 168 to swing the catch release to the left, and again release the tool body 56. This is shown in Fig. 10 where the shoulder 162 is moved out of the way of the stop 160. When the catch arm 164 is thus moved out of the way the tool body will continue moving downwardly with the tool slide.

It will be noted, however, that as soon as the tool body and the bending fingers move downwardly, they will carry the component with them and, therefore, the anvil fingers 68 and 70 must be moved out of the way. To accomplish this, the entire anvil carriage 38 is pivoted in a clockwise direction as shown in Figs. 2, 7, and 13 to swing the fingers 68 and 70 out of the way of the descending tool body 56 and the bending fingers 46 and 48. When the fingers are swung backwardly out of the way, the relative parts take the position illustrated in Fig. 13. This pivotal movement of the anvil carriage is caused by the cam 94 as illustrated in Figs. 7, 13 and 13*a* moving downwardly from the position of Fig. 7 to the position of Figs. 13 and 13*a* with sliding yoke 86. The cam 94 has the surface 100 which engages the roller 96 on the anvil crank 88 to pivot the anvil 38 in a counterclockwise direction as shown in Figs. 13 and 13*a* to the position illustrated in Fig. 13. In this position, it will be noticed that the anvil fingers 68 and 70 are pivoted downwardly where they are clearly out of the way of the descending tool body 56. With the anvil out of the way the component bending fingers carry the component downwardly to insert the leads into the circuit board.

*Inserting the component leads into the circuit board*

When the tool body 56 moves downwardly it is so positioned with respect to the circuit board shown at 50 in Figs. 14 and 15 so that the ends of the leads 40 and 42 enter the holes 178 and 180 in the circuit board. It will be noted that the shoulders of the bent leads are nestled under the shoulders 154 and 156 of the lower ends of the bending fingers 46 and 48 so that the bending fingers can force the ends of the leads into the holes in the board without difficulty.

As illustrated in Figs. 14 and 15 when the leads have been inserted into the holes 178 and 180 in the circuit board 50, the lower ends 182 and 184 of the bending fingers 46 and 48 rest on the circuit board 50. This resistance to continued movement of the bending fingers pushes the tool body 56 upwardly on the tool slide 58 and causes the tool body to move to the third or retracted uppermost position with respect to the tool slide.

In the third position, the inserter plate 52, as illustrated in Figs. 14 and 15, moves downwardly with the tool slide 58 to engage the body 44 of the component and push the body down against the circuit board 50 to force the leads more deeply into the holes 178 and 180 in the circuit board and to push and hold the body against the surface of the circuit board. The inserter plate 52 moving downwardly against the component body causes the leads to slide downwardly in the grooves in the bending fingers 46 and 48. The component leads, however, slide downwardly relatively easy as held by the fingers, since the angle at which the leads slant inwardly shown in 158 in Fig. 11 is relatively small. The fingers 46 and 48 of course cannot spread because their upper lids bear against the cam plate 120.

When the lower ends 182 and 184 of the lead bending fingers engage the circuit board they force the tool body 56 upwardly on the tool slide 58 as the tool slide moves downwardly. The upper ends 126 and 128 of the bending fingers slide upwardly on the cam 120 in the position shown in Fig. 14 to the position shown in Fig. 20. Since the upper end of the cam has parallel straight edges, this causes no movement of the bending fingers. The inserter plate 52, however, moves downwardly with the tool slide 58 from the position of Figs. 14 and 15 to that shown in Figs. 18, 19 and 20.

The inserter plate 52, as may be best illustrated in Figs. 18, 19 and 20, is secured to the reverse side of the tool slide 58 by a bolt 188. The inserter plate has a vertical slot 190, Fig. 20, through which the bolt 188 extends, for purpose of adjusting the vertical position of the inserter plate. With adjustment in a vertical direction the plate can be adjusted for components having different size bodies, as will be seen at 44 in connection with Fig. 20. The plate also may be adjusted up and down to adjust the depth of insertion of the lead wires and the plate may push the body of the component tightly against the circuit board or leave a small space between the component body and the upper surface of the circuit board 50.

The lower edge of the inserter plate 52 is concave as may be seen in Fig. 19 with the groove 192 being cut in the plate so that it rests over the top of the component body 44.

Turning back to the original position of the tool body 56 in the extended position of Fig. 11, as the tool body 56 slides upwardly on the tool slide 58 from this position to the second or intermediate position of Fig. 12, there is a latch member which prevents it from sliding any further. This latch member is illustrated generally at 194 in Figs. 3 and 6. The latch member is pivotally mounted in a slot 196 in the tool body 56 as shown in Fig. 6. The latch member is supported by a pivotal pin 198 and is held in its latched position by a tension spring 200, which connects to an eye-let 202 on the tool body 56 and connects at the other end to a tripping bolt 204.

The latch member 194 has a latching projection 206 which projects into a groove 208 cut in the tool slide 58. The tool body 56 is shown in its lowermost or extended position with respect to the tool slide 58 in Fig. 6. As thus shown the latch projection 206 engages the lower end 210 of the groove 208 and prevents the tool body 56 from sliding off of the tool slide 58.

When the tool body is pushed upwardly on the tool slide to thereby cause the component lead bending fingers to move together, the latch projection 206 slides upwardly in the groove 208 until the projection strikes the upper end 212 of the groove. This uppermost position is shown in Fig. 16. In this position the tool body 56 can slide no further upwardly on the tool slide 58 since the projection 206 strikes the end 212 of slot 208. However, when the latch 194 is pivoted in a counterclockwise direction as shown in Fig. 16 so that the projection 206 moves out of the slot 208, the tool body 56 can slide further upwardly on the tool slide 58. This occurs before the body 56 slides to the retracted or third or uppermost position on the tool slide 58.

For purposes of pivoting the latch 194 to its release position as it is illustrated in Fig. 21, the latch trip bolt 204 strikes a latch trip 214. This occurs at the same time as the component bending fingers engage the circuit board 50 as is shown in Figs. 14 and 15. The latch trip 214 and its relation to the rest of the structure may be best illustrated in Figs. 18 and 19. As is there shown, the latch trip consists of an underhanging lip which is part of a plate bolted to the bottom of the horizontal frame plate 80 so as to project into the path of the descending trip bolt 204 as it moves downwardly carried on the tool body 56.

As the tool body is carried downwardly and the lower ends of the fingers engage the circuit board 50, the latch trip bolt 204 simultaneously engages the latch trip 214 to pivot the latch 194 in a counterclockwise direction and thus pivot the projection 206 out of the slot 208. As the tool body 56 slides upwardly with respect to the tool slide 58, the tool body and the latch move upwardly until the relative position is reached between the latch and the slot 208 shown in Fig. 21.

When the sliding yoke 86 carrying the tool slide 58 reaches its lowermost position, the inserter plate 52 pushes the component body against the circuit board 50. At this point the leads of the component which have been projected through the board to the position shown in Fig. 20, may be crimped beneath the board.

Although this crimping is not an essential part to the overall operation of the machine it is advantageous in that the ends of the leads be bent over against the lower surface of the circuit board to more firmly secure the components to the board.

For crimping the leads, a pair of crimping fingers 216 and 218 are provided. These fingers are supported at the top of the rods 220 and 224 and are pivotally secured to the post in such a manner that they may be pivoted laterally to engage the leads and bend them against the lower surface of the circuit board.

Any suitable arrangement may be used for actuating the crimping fingers 216 and 218 and, as shown, a pair of sleeves 226 and 228 are caused to move upwardly on the rods 220 and 224 to engage the fingers and cause them to have pivotal movement. When the leads have been crimped beneath the board the crimping fingers may be lowered out of the way and the leads 40 and 42 will then have been crimped beneath the board and have the appearance illustrated in Fig. 22.

The tool body 56 is next raised away from the circuit board for a succeeding operation. To prevent the fingers 46 and 48 as shown in Fig. 20 from moving upwardly and accidentally pulling the component upwardly with them, the fingers are spread apart before they are lifted to their return position. Another reason for the spreading of the fingers is that they must be moved apart to their original spread position so as to be ready for the next operation of bending the leads of a new component.

*Raising the inserter fingers and tool holder*

As the cycle of the machine is automatically completed and the air piston raises the sliding yoke 86 which raises the tool slide 58, the tool holder 56 is first locked in its lowermost position. It will remain locked until it has been pulled down on the tool slide to its lowermost position.

The mechanism for locking the tool holder in this position includes the catch arm 164 and a lower hook 217 which may be viewed in Figs. 8, 9, 10, and 23. This hook 217 on the catch arm catches on the top of an upper stop 219, which is pictured in Figs. 8, 15, and 23.

As may be seen in Figs. 15 and 18, when the tool slide was moving downwardly and the release cam plate 170 was moving with it, the catch release roller 168 rolled against the cam plate into the recessed part near the top of the cam plate permitting the catch arm 164 to swing inwardly to its position of Figs. 15 and 18. As this occurs the hook 217 rides over the top edge of the upper stop 219.

When the tool slide 58 rises, the hook 217, of course, grips the upper stop 219, which is secured to the tool body 56 by bolts 221, Fig. 23. The hook 217 retains the tool body 56 downwardly while the tool slide 58 rises.

When the tool slide rises to a point where the tool body is pulled to the lowermost position on the slide as is illustrated in Fig. 23 the release cam plate 170 pushes the catch release roller 168 to the left to cause the hook 217 to disengage from the upper stop 219. During the time the tool body 56 has been pulled to the lowermost position the lead bending fingers 46 and 48 have moved to the spread position as shown in Fig. 22. This has been caused by the cam 120 being pulled out from between the upper ends 126 and 128 of the bending fingers.

When the tool body 56 is pulled down on the tool slide 58 the latch projection 206, as shown in Fig. 6 has slid down from its position of Fig. 21, through the position of Fig. 16, and finally strikes the lower end 210 of slot 208. The tool body cannot slide off the end of the slide because the latch projection 206 has engaged the lower end 210 of the groove 208 as is illustrated in Fig. 6. With the relative parts moved back to their original position the tool body and its associated parts are again raised to a position where they will operate on the next succeeding component. As the sliding yoke 86 ascends, carrying the mechanism with it, it goes through the area of normal travel, as indicated by the space 146 in Fig. 1, until it reaches the path of slow travel represented by the space 148. This point covers the area where the succeeding component is dropped on the anvil and it has been found that a slow travel in this area will prevent components from either being dislodged or damaged so that they are not properly seated on the anvil fingers.

*Feeding a new component*

When the sliding yoke 86 ascends it carries with it the cam 94, which as it moves upwardly, permits the anvil crank 88 and the anvil 38 to swing back to normal position which is the position illustrated in Fig. 2. As this occurs a component is permitted to drop down on the anvil support fingers.

As is illustrated in Fig. 2, the components rest in the zigzag slot 62 of the feeder 30 with the lowermost component 64 being held in its position by the component stop finger 66. This stop finger is mounted on the anvil and as the anvil swings downwardly the finger will move out of the way of the foremost component.

The stop finger engages at its upper end a block 230 which is secured to a leaf spring 232, Fig. 2. The leaf spring 232 is suitably mounted on feeder 30. The leaf spring has a downwardly projecting finger 234 on its lower free end, which, when the spring is released by the stop finger 66, projects into the path of the components as they move down to the slot 62 of the feeder. Thus as the finger 66 moves out of the way of the foremost component, when the anvil carriage is pivoted in a clockwise direction, the entire line of electrical components is released and the components move ahead the space of one component until they engage the finger 234. The result of this action is shown in Fig. 13 with the foremost component 64 resting against the finger 234. When the inserting mechanism again rises and the anvil pivots back to normal position the stop finger 66 moves upwardly between the foremost component 64 and the next component 236 as is shown in Fig. 13. When the finger engages the block 230 it pushes the leaf spring 232 upwardly to move the end 234 away from the foremost component 66. When the foremost component is released it drops down on the anvil fingers 68 and 70 to the dotted line position 65 shown in Fig. 17. In this position the new component is supported by the anvil fingers and is ready to be engaged by the lead bending fingers as they again descend.

It will be noted from Fig. 17 that the component may roll down on the anvil before the bending fingers 46 and 48 have a chance to clear the anvil. As shown in that figure the component leads are resting against the back of the lead bending fingers. Since the back faces of the fingers are smooth the leads of the components will merely ride against the fingers and then drop down into the notches of the anvil fingers when the bending fingers are sufficiently raised. This action indicates that the distance 148 of slow travel as shown in Fig. 1 will reduce the tendency of the bending fingers to lift the component leads upwardly and dislodge them from the anvil fingers.

*General operation of the machine*

Although the overall operation of the machine will now appear clear from the preceding description, a summary of the operation will again be given. As is illustrated in Fig. 1, pressurized air is admitted to the air line 144 and air line 142 is vented to cause the piston 137 within the cylinder to descend. The piston first begins moving down slowly until it covers the distance indicated at 148. When it enters the distance indicated at 146 it travels the rest of its travel rapidly.

When the piston descends, it moves the sliding yoke 86 downwardly carrying the tool slide 58 downwardly. In this downward movement the bending fingers 46 and 48 first engage the component leads 40 and 42 as illustrated in Fig. 11. When the leads are bent downwardly and the shoulders 154 and 156 of the bending fingers are opposite the component body, the fingers are caused to move inwardly to bend the leads downwardly toward the circuit board. This inward movement of the bending fingers is caused by the tool holder 56 being temporarily locked and the tool slide 58 continuing its downward movement, thus forcing the tool body relatively upwardly on the tool slide and forcing the spreader cam 120 between the upper ends of the bending fingers. The movement of the cam between the upper ends of the bending fingers is illustrated in Fig. 12.

The locking of the tool body is caused by the lower stop 160 striking the shoulder 162 of the catch 164 in the manner illustrated in Figs. 8 and 9. The shoulder 162 continues to engage the lower stop 160 until the release cam 170 pushes the roller 168 to one side to pivot the shoulder out of the way of the lower stop.

When the tool holder 56 is released the leads 40 and 42 of the component have been bent in the manner shown in Fig. 12. The cam 94 as shown in Fig. 13A then pivots the anvil to the out of the way position so that the bending fingers can move past the anvil and carry the electrical component with them. When the component is carried downwardly the leads are inserted into holes in the circuit board in the manner shown in Fig. 14.

At that point the bending fingers engage the top surface of the circuit board 50 which pushes the tool holder relatively upwardly. Simultaneously with the fingers engaging the top surface of the board, the latch 194 as is shown in Fig. 16 is pivoted counterclockwise to the release position of Fig. 21. This permits the tool body 56 to be unlocked on the tool slide 58 and slide relatively upwardly to its uppermost position.

It will thus be seen that the tool body 56 has moved to a series of three positions on the tool holder 58. In the first position the fingers are spread and in the second position the fingers are moved together. In the third position the inserter plate 52 moves downwardly to engage the body of the electrical component and pushes it out from between the bending fingers to shove the leads of the component the remainder of the way through the circuit board. This pushes the leads through the circuit board to the position illustrated in Fig. 20. At that point the leads may be crimped over beneath the board if so desired by crimping fingers 216 and 218 whereupon they assume the appearance shown in Fig. 22.

The piston with the cylinder 140 then begins its travel upwardly, first drawing the tool slide 58 upwardly. The tool holder 56 does not begin to move upwardly with the tool slide since it is locked in its lowermost position by the hook 217 catching on the upper stop 219. This operation is shown in Fig. 15. The hook 217 of the catch arm 164 continues to engage the upper stop 219 until the tool holder 56 assumes its lowermost position on the tool slide 58 to spread the bending fingers to the position of Fig. 22. At that point, as is illustrated in Fig. 23 the release roller 168 is pushed outwardly by the release cam 180 since it is moving upwardly with the tool slide. When the roller 168 is pushed outwardly the end hook 217 releases the upper stop 219 and permits the tool holder to move upwardly with the tool slide. The tool holder does not slide off the lower end of the slide because the latch projection 206 as shown in Fig. 6 strikes the lower end 210 of the groove 208.

As the inserting mechanism moves upwardly the component stop finger as illustrated in Fig. 13 moves upwardly between the component 64 and the component 236 and as it moves upwardly it engages the block 230 pushing the spring leaf 232 upwardly. As the spring moves upwardly the lower end of the spring 234 releases the foremost component 64 and permits it to drop down on the anvil fingers 68 and 70.

During the last stage of the up travel the piston has reached the slow portion 148 as indicated in Fig. 1 so that the component may drop down gently onto the anvil fingers. When the sliding yoke 86 reaches the top of its travel the anvil pivots to its normal position and the tool body is again ready to move downwardly to bend the leads of a new component and attach the component to a succeeding circuit board.

Thus it will be seen that the mechanism can be operated continuously with the components being fed automatically and a series of circuit boards may be handled successively. The components may be attached either to one circuit board which is repositioned so that new holes are present beneath the attaching head or they may be attached to a succession of circuit boards with new boards moved beneath the attaching head. It will be seen from the design of the mechanism and of the fingers which bend the component leads and carry the component down against the board that the component is securely held and handled so that it cannot drop away from the fingers. The mechanism is thus well adapted to a continuous operation without the danger of losing the component or resulting in a defective attachment of the component to the board. The mechanism is of rugged and simple construction and easily assembled or disassembled. The mechanism also consists of relatively few moving parts, none of which need critical adjustment and, therefore, the machine is well adapted to continuous operation.

We have, in the drawings and specification, presented a detailed disclosure of the preferred embodiments of our invention. It is to be understood that the invention is susceptible of modifications, structural changes and various applications of use within the spirit and scope of the invention and we do not intend to limit the invention to the specific form disclosed but intend to cover all modifications, changes and alternative constructions and methods falling within the scope of the principles taught by our invention.

We claim as our invention:

1. A mechanism for bending electrical component leads in preparation for attaching the component to a circuit board comprising means to support the component while the leads are being bent, bending fingers for bending the component leads at an angle to the axis of the component body so that they may enter the holes in the circuit board, a carrier tool supporting the bending fingers, a holder to support the carrier tool and move it downwardly to carry the bending fingers past the component supporting means, the carrier tool being movably supported on the holder, a latch positioned to stop the movement of the carrier tool after the fingers have engaged the component leads, means to move the bending fingers together to bend the component leads when the carrier tool is latched with respect to the holder, and latching release means to release the carrier tool after the leads have been bent.

2. A mechanism for bending electrical component leads in preparation for attaching the component to a circuit board comprising an anvil member supporting the component while the leads are being bent, bending fingers for bending the component leads so that they may enter the holes in the circuit board, a carrier tool supporting the fingers for movement between a spread position and a closed position bending the leads of the component, a holder for the carrier tool capable of moving the tool past the supporting anvil with the tool movable between a finger-spread position and a finger-closed position on the holder, a latch adapted to stop the motion of the carrier tool after the fingers have engaged the leads, a cam member secured to the holder engaging the fingers to move them together to closed position when the carrier tool moves to the finger-closed position with respect to the holder, and means to release the latch to permit the carrier tool to move with the holder after the relative movement of the carrier tool with respect to the holder has caused the cam to move the fingers together and bend the component leads.

3. A mechanism for bending electrical component leads in preparation for attaching the component to a circuit board comprising an anvil member for supporting the component while the leads are being bent, bending fingers for bending the component leads over the anvil member in order that they may enter holes in the board, a carrier tool supporting the fingers, the fingers being pivotally mounted on the rear face of the tool, means to move the carrier tool to move the bending fingers past the anvil, a tool stop on the front face of the carrier tool, a tool catch positioned to engage the tool stop and hold the tool after the fingers have engaged the component leads, and means to move the bending fingers together to bend the lead ends toward each other when the carrier tool motion is stopped by said tool catch.

4. A mechanism for attaching electrical components to circuit boards comprising an anvil member for supporting the component while the leads are being bent, bending fingers for bending the component leads over the anvil member, a carrier tool for supporting the bending fingers, a holder for the carrier tool carrying the tool and fingers past the anvil to bend the leads and move them against the circuit board to insert the leads into the board and again moving away from the board, means for moving the carrier tool to a finger-closing position with respect to the holder after the leads have been engaged by the fingers, finger-operating means operating to move the fingers together to bend the leads when the carrier tool has been moved to finger-closing position on the holder, latch means engaging the carrier tool when it has inserted the leads into the board to cause it to move to a finger-opening position with respect to the holder when it moves away from the board to separate the fingers and release the electrical component, and means to release the latch when the fingers have been spread apart.

5. A mechanism for attaching electrical components to circuit boards comprising an anvil member for supporting the component with the leads projecting outwardly while the leads are being bent, bending fingers for bending the component leads against the anvil in order that they may be inserted into holes in the component boards, a carrier tool for supporting the bending fingers, a holder for the carrier tool carrying the tool and fingers past the anvil to bend the leads and against the circuit board to insert the ends of the leads into the board and again moving away from the board, means for moving the carrier tool to a finger-closing position with respect to the holder after the leads have been engaged by the fingers, finger-operating means moving the fingers together to bend the leads inwardly and grip the component when the carrier tool has been moved to finger-closing position on the tool holder, catch means engaging the carrier tool when it has inserted the leads into the board, said catch means holding the carrier tool to cause it to move to the finger opening position with respect to the holder when it moves away from the board to thereby separate the fingers and release the electrical component, and a cam supported on the holder and moving therewith away from the board, said cam positioned to engage said catch means and move it to release position to permit the carrier tool to move with the holder after the tool has been moved to finger-opening position.

6. A mechanism for attaching electrical components to circuit boards comprising fingers for bending the component leads and inserting them in the circuit boards, a carrier tool for supporting the bending fingers, a holder for the carrier tool upon which the tool is slidably mounted, means to move the holder against the circuit board to insert the component leads into holes in the board and to again move the holder away from the board, means for slidably moving the carrier tool to a finger-closing position with respect to the holder, finger-operating means automatically moving the fingers together when the carrier tool slides to finger-closing position to thereby bend the leads together so that they may be inserted into the board, a movable catch being biased to a position wherein it engages and holds the carrier tool when it has inserted the leads into the board to hold the tool and cause it to move to a finger-opening position relative to the holder when it moves away from the board to thereby separate the fingers and release the electrical component, and a cam carried by the holder and positioned to engage the movable catch as the tool moves away from the board to cause it to release the carrier tool after the fingers have moved apart to thereby release the electrical component which has been attached to the circuit board.

7. A mechanism for attaching electrical components to circuit boards comprising means for supporting the component while the leads are being bent, bending fingers for bending the component leads toward each other, a carrier tool for supporting the bending fingers, a holder for the carrier tool for carrying the tool and fingers against the circuit board to insert the leads into the board and away from the circuit board to receive a new component, a catch adapted to engage the carrier tool to move it to a finger-closing position with respect to the holder after the component leads have been engaged by the fingers, finger-operating means adapted to move the fingers together to bend the leads when the carrier tool has been moved to finger-closing position on the tool holder, and a first catch release means adapted to move the catch to release position after the leads have been bent so that the carrier tool may be released to move with the holder, said catch adapted to also engage and hold the carrier tool when the component leads have been inserted into the circuit board to cause the carrier tool to move to finger-opening position when the tool holder moves away from the circuit board to thereby separate the bending fingers to cause them to release the component, and a second release means to move the catch to release position and permit the tool carrier to move with the holder after the fingers have moved to spread position to release the component.

8. A mechanism for attaching electrical components to circuit boards comprising an anvil member for supporting the component while the leads are being bent, fingers for bending the component leads, a carrier tool for supporting the bending fingers, a movable holder for the carrier tool carrying the tool and fingers past the anvil to bend the leads and moving the component against the circuit board to insert the leads into the board and also moving away from the board after the leads have been inserted, a catch positioned adjacent the path of movement of the carrier tool as it moves toward and away from the circuit board, the catch arm provided with a first catching surface for engaging and stopping the movement of the carrier tool in its movement toward the circuit board, and a second catch surface for engaging and holding the carrier tool in its movement away from the circuit board, the carrier tool movable on the holder between a finger-closing position and a finger-spreading position, means to move the fingers together to bend the leads of the component toward each other when the carrier tool is moved to finger-closing position as it is held by the first surface of the catch, and means to move the fingers to spread position as the carrier tool is engaged by the second surface of the catch and moved to finger-spreading position, and a first release means to move the catch arm to release position away from the carrier tool after the fingers have moved together and bent the leads, and a second release means moving the catch arm away from the carrier tool to release it after the fingers have moved apart to spread position to thereby release the component after it has been inserted into the board.

9. A mechanism for attaching electrical components to a circuit board comprising bending fingers for bending the component leads, means for supporting the component while the leads are being bent toward the circuit board, a carrier tool for supporting the bending fingers, a holder for the carrier tool carrying the tool and fingers past the anvil to bend the leads and against the circuit board to insert the leads into the board and again moving away from the board, said carrier tool movably mounted on the holder for movement between a finger-closing position and a finger-spreading position, finger-operating means adapted to move the fingers together to bend the component leads when the carrier tool moves to finger-closed position on the holder and adapted to move the fingers to open position when the carrier tool moves to finger-open position with respect to the holder, a first catch operable to engage the tool and hold it as the holder moves toward the circuit board to move the carrier tool to finger-closed position after the fingers have engaged the leads, a first catch release operable to move the catch to release position after the fingers have been moved together to bend the leads, a second catch adapted to engage the carrier tool and hold it as the holder moves away from the circuit board to cause the fingers to move apart and release the component, and a second catch release operable to release the catch after the fingers have moved apart to spread position.

10. A mechanism for attaching electrical components to circuit boards comprising an anvil for supporting the component while the leads are being bent, a pair of bending fingers with the ends adapted to engage and bend the leads toward each other, the fingers tapering back from the ends so that the tips of the leads when bent are closer together than the portion closer to the bends, means to move the bending fingers toward the board to insert the ends of the leads into the board, and a pusher member adapted to engage the body of the component between the fingers and slide the component between the fingers toward the board.

11. A machine for attaching electrical components to circuit boards comprising a pair of component supporting fingers carrying the component between them by pressing against the bent leads of the component which project downwardly toward a circuit board, a carrier tool for the fingers, a holder for the carrier tool upon which the carrier tool is movably mounted for movement between a first lead positioning position and a second lead inserting position, a component pusher member adapted to engage the body of the component after the leads have been positioned against the board to push the leads further into the board, and means to move the holder and the associated mechanism toward the circuit board to insert the component leads therein, the fingers engaging the board and forcing the carrier tool to the second lead inserting position on the holder with the holder moving the pusher against the component body to force the leads into the holes in the circuit board, said pusher being adjustably secured to the holder so that the depth of insertion of the leads may be regulated by adjustment of the position of the pusher.

12. A machine for attaching electrical components to circuit boards comprising a holder for supporting component lead bending and inserting tools, a carrier tool movably mounted on said holder and adapted to move between a finger closed position and a finger spread position relative to the holder, a pair of lead bending fingers mounted on the carrier tool, means for moving the fingers together when the carrier tool moves to finger closed position, means for moving the carrier tool to the finger closed position to bend the component leads and insert them into the circuit board, a catch pivotally mounted beside the path of the carrier tool and having an overhanging lip which moves over the tool carrier when the carrier is in a component inserting position, means for moving the tool holder away from the board to move the tool, the latch member holding the carrier tool in position to move the carrier to finger spread position, and a cam moving the latch away from the tool carrier as the holder ascends, said cam carried on the tool holder.

13. A machine for attaching electrical components to circuit boards comprising a tool slide adapted to move downwardly toward a circuit board to insert the component leads into the board, a tool body slidably mounted on the tool slide and movable thereon between a finger closed position and a finger spread position, means to slide the tool body to finger closed position as the tool slide is moving downwardly toward the board to thereby bend the component leads downwardly toward the board, a catch positioned to catch the tool body when it is in position against the circuit board and the leads are being inserted therein, means to raise the tool slide away from the circuit board, said catch drawing the tool body downwardly relative to the slide to move it to finger spread position to spread the component bending fingers before they are raised away from the circuit board, and a catch release cam moved with the tool slide and positioned to release the catch when the tool body is moved relatively downwardly on the slide to finger spread position.

14. A machine for attaching electrical components to circuit boards comprising a holder for carrying operating mechanism toward a circuit board to insert the leads of the component therein, bending fingers for bending the component leads downwardly toward a circuit board, a carrier tool supporting the bending fingers and movably mounted on the holder being movable to three positions relative to the holder, the first position being a finger spread position, the second position being a finger closed position, and the third position being a component inserting position, means to move the holder downwardly toward a circuit board, means to move the carrier tool from the first to the second position while the holder is moving toward the circuit board to close the component fingers and bend the component leads, means to move the carrier tool to the third position while the holder is moving toward the circuit board when the component leads are positioned against the circuit board, and inserting mechanism for inserting the leads into the circuit board when the carrier tool moves to the third position.

15. A machine for attaching electrical components to circuit boards comprising a pair of bending fingers adapted to bend the leads of a component downwardly toward a circuit board, a carrier tool for supporting the bending fingers, a holder for supporting the carrier tool and moving it downwardly toward a circuit board, the carrier tool movable between three positions relative to the holder, the first position being a finger spread position, the second intermediate position being a finger closed position, and the third position being a component inserting position, means to move the holder downwardly against the circuit board, means to move the carrier tool from the first to the second position relative to the holder while the holder is moving toward the board to move the lead bending fingers together to bend the component lead, means to move the carrier to the third position on the holder when the component leads are in position to be inserted into the holes in the circuit board, and means to move the carrier tool back to the first position relative to the holder to again spread the leads before the carrier tool is moved away from the circuit board.

16. A machine for attaching electrical components to circuit boards comprising a pair of inserting fingers adapted to move toward each other to bend the component leads at right angles to the component axis and toward the circuit board, a carrier tool for supporting the bending fingers, a holder for supporting the carrier tool with the carrier tool being movable between three positions on the holder, the first position being a finger spread position, the second intermediate position being a finger closed position, and the third position being a component lead inserting position with the fingers remaining closed, means for moving the holder toward the circuit board, a first latch means positioned in the path of the carrier tool and temporarily stopping the movement of the carrier tool as the holder moves downwardly toward the circuit board to move the carrier tool to the second position to close the lead bending fingers and bend the component leads, the holder continuing its movement toward the circuit board and the fingers engaging the circuit board to force the carrier tool to the third position to insert the component into the board, means connected to the holder for pushing the component into the board as the holder moves to the third position relative to the carrier tool, and second latch means positioned to temporarily stop the movement of the carrier tool and draw it downwardly back to the first position relative to the holder to spread the bending fingers as the holder is raised from the board, and means to raise the holder away from the circuit board after the component leads have been inserted into the board.

17. A machine for attaching electrical components to circuit boards comprising a lead bending finger adapted to move against a component lead and bend it toward the component body, a carrier tool for supporting the lead bending finger, a cam positioned for movement relative to the carrier tool to cam the finger to move it toward the component lead, a cam follower projection attached to the finger to act as a follower and engage the cam, and means for adjusting the position of said projection relative to the finger to thereby adjust the amount of movement given to the finger by engagement of the cam.

18. A machine for attaching electrical components to circuit boards comprising a pair of bending fingers adapted to bend the component leads toward the circuit board, an anvil for supporting the component while the leads are being bent, means to move the fingers past the anvil to bend the leads and to carry the component with the bent leads the remainder of the distance toward the circuit board, means to move the fingers together to bend the component leads after the leads have been engaged and as the fingers are moved past the anvil, said finger moving means having a first slower speed to move the fingers while the leads are being bent and having a second faster speed to carry the fingers the remainder of the distance toward the circuit board.

19. A machine for attaching electrical components to circuit boards comprising a pair of lead bending fingers adapted to bend the leads of the component, anvil means for supporting the leads while they are being bent by the fingers, means to move the fingers from a starting position past the anvil and against the circuit board to insert the component leads therein, means to move the fingers away from the circuit board after the component leads have been inserted into holes in the circuit board, and means for automatically feeding a new component to the anvil as the fingers are moved away from the board, said means for moving the fingers away from the board having two speeds with a first faster speed to move the fingers part of the way to the starting position and a second slower speed to move the fingers the remainder of the distance back to the starting position and past the anvil while the new component is being delivered thereto.

20. A machine for attaching electrical components to circuit boards comprising a pair of inserting fingers adapted to be opened and closed and adapted to bend the component leads downwardly toward the circuit board and to carry the component toward the board, a carrier tool supporting the lead bending fingers, a holder on which the carrier tool is mounted, a pusher secured to the holder and movable therewith, means for moving the holder and the carrier tool against the circuit board to position the component leads for insertion into the board, and means for holding the fingers in their closed position to support the component while the leads are being inserted into the board, and means for moving the holder and the pusher to move the pusher against the board and force the components out from between the fingers to insert the leads into the board.

21. A machine for attaching electrical components to circuit boards comprising a pair of component carrying relatively movable fingers adapted to hold the component between them with the leads projecting downwardly toward the board, means for moving the fingers against the board to position the leads for insertion into holes in the circuit board, a pusher member adapted to push the component leads into the board, and means to move the pusher member between the fingers while the fingers are held together to force the component downwardly between the fingers to insert the leads into the holes in the board.

22. A machine for attaching electrical components to circuit boards comprising a pair of bending fingers adapted to move together to engage the leads of the component and bend them toward each other, a carrier tool supporting the bending fingers, a holder for supporting the carrier tool with the carrier tool being movably mounted thereon, means for moving the fingers from a first position where the fingers are open to a second position where the fingers are closed to bend the component leads when the carrier tool moves on the holder, and a latch positioned between the holder and the carrier tool and permitting the tool to move between the first and the second position on the holder, said latch also being movable to an unlatched position where the carrier tool may be movable to a position other than said first position or said second position.

23. A machine for attaching electrical components to circuit boards comprising a pair of lead bending fingers adapted to bend the leads of the electrical component, a carrier tool for supporting the lead bending fingers, a holder for the carrier tool with the carrier tool being slidably mounted thereon, a latch member mounted on the carrier tool and projecting into a slot in the holder, said slot permitting movement of the carrier tool between a first position where the lead bending fingers are spread and a second position where the lead bending fingers are together to bend the leads, means for moving the holder toward the circuit board, a latch release means positioned in the path of the latch to engage the latch and trip it to permit the carrier ot move to a third position on the holder, a pusher member secured to the holder and adapted to engage the component to push it into the circuit board after the component has been carried to the board by the fingers and the latch has been tripped and the carrier moved to a third position, and a means to move the holder toward the circuit board to carry the lead bending fingers and the component to the circuit board.

24. A machine for attaching electrical components to circuit boards comprising a pair of lead bending fingers adapted to move together to bend the component leads, a carrier tool supporting the lead bending fingers, a holder for the carrier tool with the carrier tool being movable thereon between a first, a second, and a third position, a latch member between the holder and the carrier tool and permitting free movement between the first and second position, tripping means to release the latch to permit the carrier tool to move to the third position on the holder, means to move the carrier tool between the first and second positions on the holder, finger moving means adapted to move the fingers together when the carrier tool moves to the second position on the holder, and means to move the holder against the circuit board with the latch tripping means releasing the latch while the holder is moving the carrier tool against the circuit board to permit the carrier to move to the third position on the holder.

25. A machine for attaching electrical components to a circuit board comprising an anvil for supporting the electrical component while the leads are being bent, a bending finger for engaging a lead of the component to bend it against the anvil toward the circuit board, and a lead engaging tip on the finger tapered back from the lower end in a straight line taper which produces an underbend on the component lead and terminates in a shoulder for pushing on the bent component lead.

References Cited in the file of this patent

UNITED STATES PATENTS

| | | |
|---|---|---|
| 1,859,951 | Blevney | May 24, 1932 |
| 1,939,021 | Pass | Dec. 12, 1933 |
| 2,308,919 | Hitt | Jan. 19, 1943 |